United States Patent [19]

Bowers et al.

[11] Patent Number: 5,055,723
[45] Date of Patent: Oct. 8, 1991

[54] JFET ANALOG SWITCH WITH GATE CURRENT CONTROL

[75] Inventors: Derek F. Bowers; Douglas S. Smith, both of Sunnyvale, Calif.

[73] Assignee: Precision Monolithics, Inc., Santa Clara, Calif.

[21] Appl. No.: 316,874

[22] Filed: Feb. 28, 1989

[51] Int. Cl.$^5$ .................... H03K 19/94; H03K 17/684
[52] U.S. Cl. .................................... 307/581; 307/450; 307/455; 307/571; 307/573
[58] Field of Search ............... 307/304, 443, 448, 450, 307/455, 571, 573, 581

[56] References Cited

U.S. PATENT DOCUMENTS

| | | | |
|---|---|---|---|
| 4,712,025 | 12/1987 | Weiss | 307/571 |
| 4,808,851 | 2/1989 | Chantepie | 307/450 |
| 4,831,284 | 5/1989 | Anderson et al. | 307/450 |
| 4,883,985 | 11/1989 | Katsu et al. | 307/448 |

OTHER PUBLICATIONS

GigBit Logic, S0030, "Dual GaAs SPST Switch", Aug. 1988.

Precision Monolithics, Inc. 1988 Analog IC Data Book, pp. 13-8–13-14.

Primary Examiner—Stanley D. Miller
Assistant Examiner—Margaret R. Wambach
Attorney, Agent, or Firm—Koppel & Jacobs

[57] ABSTRACT

An analog switching circuit may be implemented with MESFETs without forward biasing the switching device, and is applicable to JFET switches in general. Switching currents are provided from a nominal input line which closely tracks the true analog input voltage, but is segregated therefrom. A current supply fed from the nominal input line provides transient charging current to the gate of the switching transistor during the switching transition from OFF to ON states. Voltage setting devices hold the gate and source of the enhancement-mode current supply at approximately the nominal supply voltage level when the switching transistor is ON, while a control section holds the gate and source of the current supply device at a negative reference voltage level when the switching transistor is OFF. In either case, the current supply device is inhibited from delivering gate current to the switching transistor during steady state operation.

27 Claims, 1 Drawing Sheet

JFET ANALOG SWITCH WITH GATE CURRENT CONTROL

BACKGROUND OF THE INVENTION

1. Field of the Invention

This invention relates to analog electric circuits, and more particularly to switching circuits in which the switch element is implemented with a metal-semiconductor field effect transistor (MESFET).

2. Description of the Prior Art

The JFET has had a dramatic effect on the development of modern monolithic operational amplifiers and switch circuits. The device was first proposed by Shockley in 1952. It uses the depletion region of a reverse-biased PN junction to modulate and "pinch off" the cross-sectional area of a channel region between the drain and source by varying the thickness or depth of the channel in which the drain current flows. The channel is of the same type doping as the source and drain regions, and is created during the fabrication process. Because the channel exists and conducts current when the gate-source voltage is zero, JFETs are generally referred to as depletion mode devices; the application of an appropriate gate-source voltage will typically deplete the channel and thereby reduce the drain current flow. However, enhancement-mode MESFETs have also been fabricated.

A relatively new JFET structure, the metal-semiconductor FET (MESFET) is a very high frequency device that can provide gain at microwave frequencies. It uses a Schottky contact for the gate on an n-channel JFET. A thin layer of N-type gallium arsenide (GaAs) is used for the channel region. The spread of the depletion region of the Schottky-gate contact into the N-type region of the GaAs modulates the drain-source current flow. The structure can be made very small, and no diffusions are needed in the fabrication. The GaAs substrate is a better insulator than silicon and makes a good supporting structure.

One difficulty encountered in using a JFET as an analog switch is that the gate-source must not be forward biased by more than about 0.5 volts. Otherwise gate current will flow into the transistor, which can cause the output voltage to vary from its desired matching with the input. This contrasts with a metal-oxide semiconductor FET (MOSFET), which can be switched by simply raising its gate voltage up to a positive level in excess of threshold to turn it on, or keeping its gate voltage at zero or a negative level to hold it off.

Switching circuits for silicon JFETs have been devised which use bipolar transistors to drive the switching JFETs. Such a circuit is utilized, for example, in the SW-01/SW-02 JFET analog switches produced by Precision Monolithics Inc., the assignee of the present invention, and illustrated in the Precision Monolithics Inc. 1988 Analog IC Data Book, pages 13-8 through 13-14. The MESFET fabrication process, however, does not lend itself to combinations with bipolar transistors.

A simplified schematic of a JFET analog switching circuit that may be said to represent the state of the art prior to the present invention is shown in FIG. 1. In this circuit, a switching JFET 2 has its drain connected to the input terminal 4 for an input analog signal, and its source connected to an output terminal 6. The drain is connected to the device's gate through a resistor 8 which limits current variations due to processing differences. The switch is operated by a digital control signal applied to control terminal 10 at the gate of enhancement-mode JFET 12, the drain of which receives current from the gate of JFET 2 through Schottky diode 14, and the source of which is connected to a negative voltage terminal 16. While this circuit does switch an analog input voltage in response to a signal at the control terminal, this operation is degraded by a current flow from the input terminal 4 down to the negative voltage terminal 16 when the switch is off.

SUMMARY OF THE INVENTION

In view of the above problems with the prior art, the object of the present invention is to provide an improved JFET switching circuit that is capable of switching analog voltages while preserving the restriction against excess gate-source forward biasing, and which may be implemented with GaAs MESFET switches.

This object is achieved with a JFET switching circuit in which a true analog input voltage is switched, while a nominal input voltage tracks the true input voltage and supplies currents and voltage settings for a switch control circuit. By separating the true and nominal input voltage lines and deriving the switch output only from the true input level, the output voltage is held at a true level despite fluctuations in the nominal voltage level due to currents drawn by the control circuit.

The control circuit includes a current supply element, preferably an enhancement-mode FET, which supplies current to the gate of the switching JFET only during a transient period when the JFET is being turned ON; the current supply is held OFF during steady state operation. The current supply FET has a substantially smaller area gate than the switching JFET, and accordingly turns on much faster than the switching JFET to supply the necessary gate current during the transient period. When the switching JFET is ON, a pair of voltage setting means, preferably implemented with of depletion-mode FETs connected to the nominal input voltage line, are connected in circuit with the gate and source of the current supply FET to hold it OFF while the switching JFET is ON.

To turn the switching JFET OFF, a control section of the switching control circuit responds to an appropriate control signal to apply an inhibit voltage from a negative voltage line to the switching JFET gate. The control circuit applies the same negative voltage level to both the gate and source of the current supply FET, thereby holding that element OFF also, and preventing any flow of gate current to the switching JFET. The control section is preferably implemented by a pair of enhancement-mode FETs cascoded with a pair of depletion-mode FETs. The control signal is applied to the gates of the enhancement-mode FETs, while the negative voltage line is connected to the gates of the depletion-mode FETs. One branch of the cascoded circuit is connected in common to the gate of the switching JFET and the source of the current supply FET, while the other branch is connected to the gate of the current supply FET.

The switching JFET, as well as the other JFETs, are preferably GaAs MESFET devices. With the described switching circuit, the flow of current into the switching MESFET gate is inhibited at all times except during a transient period necessary to turn the device ON. The circuit is completed with a second depletion-mode switching MESFET and a switch control circuit therefore which switches the second switching MESFET in a manner complementary to the first MESFET. The second switching MESFET connects the output line to a predetermined voltage reference level, such as ground, when the first MESFET is OFF.

These and other features and advantages of the invention will be apparent to those skilled in the art from the following detailed description of a preferred embodiment, taken together with the accompanying drawings, in which:

DETAILED DESCRIPTION OF THE INVENTION

Figures 1, 2, 3:
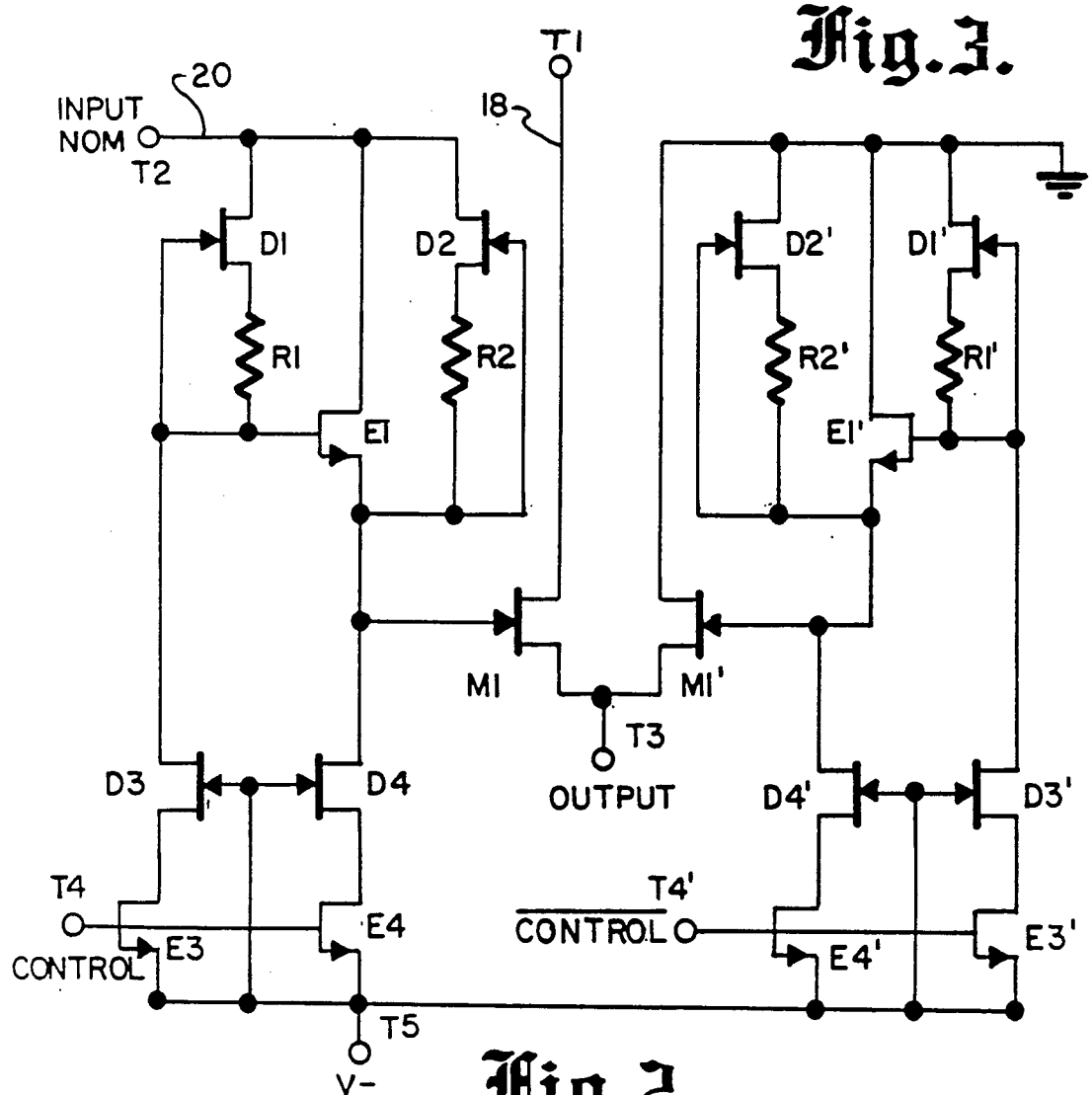
FIG. 1 is a simplified schematic diagram of a prior JFET switching circuit, described above.
FIG. 2 is a schematic diagram of a JFET switching circuit in accordance with the present invention.
FIG. 3 is a block diagram of an analog voltage supply circuit for the switching circuit of FIG. 2.

While the invention will be described herein with a MESFET employed as the switching element, it should be understood that it is also applicable to JFETs in general as the switching element, using silicon or other semiconductor materials. However, since the invention for the first time makes available the use of a GaAs MESFET as a switching element for an analog switch, it will be so described. The other transistors in this preferred embodiment are also MESFETs, but they likewise could be implemented with different devices.

Referring to FIG. 2, two separate input voltage lines are provided for the switching circuit. The first input line 18 is connected to an input terminal T1 which receives an analog input voltage signal to be switched. Since the voltage on this line is equal to the true input level, it is referred to herein as the true input voltage line. A second input voltage line 20 is connected to a terminal T2 which receives a nominal input voltage. As explained below, the voltage on the nominal input line 20 tracks the true input voltage level on line 18, but may vary slightly from that level up to a few millivolts due to currents drawn by the switching circuit. The voltage on true input line 18 is applied to the drain of a switching MESFET M1. The drain of M1 is connected to an output terminal T3, while its gate is connected to a switching circuit to be described.

To achieve a low switch resistance, M1 is preferably a relatively large area device. This results in a large capacitance associated with the device, and the need for a large gate drive current to turn the device ON. However, since M1 cannot be forward biased ("forward biased" as used herein refers to a gate-source forward bias in excess of about 0.5 volts), its steady state gate current should ideally be zero. A special switching circuit is described below which provides a large transient gate drive current for M1, but inhibits gate current and prevents M1 from being forward-biased when it is either ON or OFF in steady state.

The switching circuit includes a current supply element in the form of enhancement-type FET E1, which has its drain connected to nominal input voltage line 20 and its source connected to the gate of M1. E1 has a gate which is much smaller in area than that of M1, enabling E1 to switch much faster than M1. During the transient period when M1 is switching from OFF to ON, E1 switches ON much more quickly than M1 to supply the necessary gate charging current to M1.

Two voltage setting mechanisms are connected from nominal input line 20 to the gate and source of E1, respectively, to hold the latter device OFF when M1 is ON in steady state, and thereby prevent the supply of gate current from E1 to M1. The voltage setting mechanisms are implemented as a first depletion-type FET D1 having its drain connected to nominal input line 20, its source connected through resistor R1 to the gate of E1, and its gate connected directly to the gate of E1. The other voltage setting means is a second depletion-type FET D2 having its drain connected to the input voltage line 20, its source connected through a resistor R2 to the source of E1, and its gate connected directly to the source of E1. The function of R1 and R2 is to limit current variations through D1 and D2 stemming from processing variations, and they are sized accordingly.

The switching circuit also includes a control section, which responds to a digital switch control signal at a control terminal T4 to turn M1 ON or OFF. While other control schemes could be envisioned, the preferred form of the control section is a cascoded circuit consisting of a pair of enhancement-type FETs E3 and E4 having their gates connected in common to the control terminal T4, and a pair of depletion-type FETs D3 and D4 connected in series with E3 and E4, respectively. Both the sources of E3 and E4 and the gates of D3 and D4 are connected to a negative voltage terminal T5, which is maintained at a negative voltage level such as −5 volts. The drains of E3 and E4 are connected respectively to the sources of D3 and D4. The drain of D4 is connected to the junction between the gate of M1 and the source of E1, while the drain of D3 is connected to the gate of E1. Gate current to M1 is inhibited by the operation of the control section when M1 is OFF, as described below.

With M1 ON, the analog input voltage at T1 is applied through M1 to the output terminal T3, subject only to a small IR voltage drop through M1. To hold the output voltage at a known level when M1 is OFF, a second switching circuit is provided and operated in a manner complimentary to that for M1. The second switching circuit consists of a switching JFET M1', preferably a MOSFET like M1, which is held ON when M1 is OFF, and vice versa. The drain of M1' is held at a known reference voltage level, such as ground, while its source is connected to output terminal T3. The switching circuit for M1' is essentially the same as for M1; corresponding elements are indicated in FIG. 2 by the same symbols as for the M1 switching circuit, with the addition of a prime symbol. However, the drains of E1', D1' and D2' are connected to the same ground line as the drain of M1', rather than to a nominal voltage line. Also, the control signal applied to control terminal T4' is inverted with respect to the control signal at T4, so that M1' switches in a manner inverse to M1.

A block diagram of a circuit for providing the true and nominal analog input voltages is shown in FIG. 3. In this embodiment, the source of analog voltage to be switched is indicated by S1. S1 is connected to a pair of high input impedance, low output impedance buffer circuits B1 and B2. The buffer circuits should be designed so that their output voltages do not change significantly despite the transmission of relatively high currents. In this way, the outputs of B1 and B2 can be connected to the true and nominal voltage terminals T1 and T2, respectively, and the nominal voltage on T2 will closely track the true voltage on T1 to within a few millivolts despite substantial currents drawn through B2. One example of a fast buffer that would be suitable for this application is the BUF-03 by Precision Monolithics Inc., the assignee of the present invention.

The operation of the switching circuit will now be described. First, assume that a control signal has been applied to control terminal T4 to turn switch M1 OFF. Because the device is OFF, no gate current flows into M1. The control signal on T4 applies a forward bias to E3 and E4 in excess of their threshold (typically 0.15 volts), holding E3 and E4 ON. This causes the negative voltage at terminal T5 to appear at the sources of D3 and D4. Since the same negative voltage is applied from T5 directly to the gate of these depletion devices, D3 and D4 are also ON. The negative voltage is thus applied via E4 and D4 to the gate of M1, holding that device OFF, and to the source of E1. The same negative voltage is applied through E3 and D3 to the gate of E1. Since the gate and source of enhancement device E1 are at the same voltage level, E1 is held OFF.

The current through D3 and E3 is provided by D1, while the current through D4 and E4 is provided by D2. Since the voltage drops across R1 and R2 are relatively small, the difference between the gate and source voltages of D1 and D2 is less than the threshold level, and these devices remain ON.

When the control voltage at T4 goes low to begin a transient period during which M1 is switched from OFF to ON, the forward bias is removed from E3 and E4 to rapidly turn these devices OFF. This pulls up the source voltages of D3 and D4 to a level which exceeds their gate voltages by more than the threshold amount (the gate voltages are still tied to the negative voltage level at T5), causing D3 and D4 to also turn OFF. Since R1 and the gate of E1 are substantially less capacitive than the large gate of M1, the gate voltage of E1 pulls up rapidly to turn that device ON. Charging current is then provided via E1 to the gate of M1; this charging current is maintained until the gate capacitance of M1 has been satisfied and M1 turns ON. D1 and D3 remain ON during this transient period. Once M1 turns on, its gate voltage will be approximately equal to its drain voltage. D1 and D2 remain ON, but since D3 and D4 are OFF, D1 and D2 do not conduct current or support a voltage drop. Thus, D1 sets the gate voltage of E1 at the nominal input level, while D2 does the same for the gate voltage of M1 and source voltage of E1. Since both the gate and source of E1 are at substantially the same voltage level, that enhancement-type device is OFF and no longer supplies gate current to M1. Any leakage current through E1 is absorbed by a corresponding leakage through D4 and E4.

With M1 ON, the switching circuit also inhibits it from becoming forward biased, thereby assuring that no gate current flows. The mechanism by which this is accomplished relies upon the fact that the nominal input voltage level closely tracks the true input voltage level. With M1 ON, its source voltage will equal the true input voltage at its drain, less a slight IR drop through M1. The gate voltage of M1 is set at approximately the nominal voltage level by D2. Since the nominal input voltage level is very close to the true input voltage, the M1 gate voltage will thus be approximately equal to its source voltage, thus assuring that M1 is not forward biased and that consequently it will have substantially no gate current.

Thus, gate current to M1 is inhibited during both ON and OFF steady state operation, while a rapid supply of the current is provided to M1 during the transient between OFF and ON. The current flows required by the switching circuit are derived from the nominal voltage line, thereby assuring that the output voltage reflects the true analog input and not the nominal input level. During the transient period when M1 is again switched back OFF, the gate voltage of E1 will be pulled down much faster than the gate voltage of M1, since E1 has a much smaller associated capacitance. Accordingly, E1 will remain OFF and will continue to be inhibited from supplying gate current to M1 during this second transient period.

To help prevent E1 from turning ON, D3 and E3 are scaled to carry more current than D4 and E4, and thus keep the gate voltage of E1 below its source voltage. M1 should have a threshold level of about $-1.8$ volts as opposed to a $-0.6$ volt threshold device; implementing it as a $-0.6$ volt threshold would require it to be even larger. The threshold levels of M1 and M1[1] should be as close to each other as possible. If the fabrication process allows, D3 and D4 should have a much lower threshold level (and thus a lower resistance per unit width when the gate-source voltage is zero) than D1 and D2. This saves a considerable amount of the area that would otherwise be devoted to the devices; it also improves switching times because the capacitance-resistance time constants of the switch is lowered, and the drive circuit has less overall capacitance t drive. While a particular embodiment of the invention has been shown and described, numerous variations and alternate embodiments will occur to those skilled in the art within the scope of the invention. It is therefore intended that the invention be limited only in terms of the appended claims.

We claim:

1. A junction field effect transistor (JFET) switching circuit, comprising:
   a first depletion-mode switch JFET having a gate, source and drain,
   a switch control circuit connected to switch said JFET in response to a control signal,
   an output line,
   a true input voltage line for carrying a true input voltage level, said true input voltage line being interconnected with the output line by the JFET source-drain circuit to apply said true input voltage to said output line in response to a control signal,
   a nominal input voltage line connected by the switch control circuit to supply switching currents to the JFET gate, and
   an input voltage supply means connected with said true and nominal input voltage lines to maintain the true input voltage line at a true input voltage level, and the nominal input voltage line at a nominal input voltage level which tracks the true input voltage level but is subject to fluctuations due to said switching currents.

2. The JFET switching circuit of claim 1, said JFET comprising a metal-semiconductor field effect transistor (MESFET).

3. The JFET switching circuit of claim 1, said JFET being implemented with gallium arsenide (GaAs).

4. The JFET switching circuit of claim 1, said voltage supply means comprising a common voltage source connected to said true and nominal input voltage lines by respective buffer amplifiers.

5. The JFET switching circuit of claim 1, further comprising a second depletion-mode switching JFET, and a switch control circuit therefor connected to switch the second switching JFET in a manner complementary to the switching of the first JFET in response to a control signal, said second JFET connecting the output line to a predetermined voltage reference level when the first JFET is OFF.

6. The JFET switching circuit of claim 1, said switch control circuit including a negative voltage line and a control section connected therewith for applying a negative voltage signal to the JFET gate to hold the JFET OFF only in response to a control signal corresponding to an OFF state for the JFET.

7. The JFET switching circuit of claim 6, said control section including a depletion-mode control FET cascoded with an enhancement-mode control FET, said depletion-mode control FETs having respective gates, sources and drains, the enhancement-mode control FET receiving the control signal at its gate and connecting the source of the depletion-mode control FET to the negative voltage line in response to an OFF control signal, and the depletion-mode control FET having its gate connected to the negative voltage line and its drain connected to the JFET gate.

8. The JFET switching circuit of claim 1, wherein said switch control circuit includes a current supply means for the JFET gate and a circuit means enabling said circuit supply means to supply current to the JFET gate only for a transient period for switching the JFET ON.

9. The JFET switching circuit of claim 8, said current supply means comprising an enhancement-mode FET having a drain, source and gate, with its drain connected to said nominal input voltage line, its source connected to the JFET gate and said circuit means, and its gate connected to said circuit means.

10. The JFET switching circuit of claim 9, said enhancement-mode FET having a smaller area gate than said JFET and thereby switching faster than said JFET during said transient period to provide gate current to said JFET.

11. The JFET switching circuit of claim 9, said circuit means including a pair of voltage setting means connected with the gate and source of said enhancement-mode JFET to bias said enhancement-mode FET when the JFET is ON so that said enhancement-mode FET is held OFF.

12. The JFET switching circuit of claim 11, said voltage setting means comprising respective depletion-mode FETs having respective drains, sources and gates, with their drains connected to said nominal input voltage line, their gates connected respectively to the gate and source of said enhancement-mode FET, and their sources connected with their respective gates.

13. The JFET switching circuit of claim 12, the sources of said depletion-mode FETs being connected to their respective gates through respective resistors which limit current variations resulting from variations in circuit processing.

14. The JFET switching circuit of claim 11, said circuit means further comprising a negative voltage line and a control section connected therewith for applying, in response to a control signal, a negative voltage signal to the JFET gate to hold the JFET OFF only in response to a control signal corresponding to an OFF state for the JFET.

15. The JFET switching circuit of claim 14, said control section including a depletion-mode control FET cascoded with an enhancement-mode control FET, said depletion-mode and enhancement-mode control FETs having respective gates, sources and drains, the enhancement-mode control FET receiving the control signal at its gate and connecting the source of the depletion-mode control FET to the negative voltage line in response to an OFF input signal, and the depletion-mode control FET having its gate connected to the negative voltage line and its drain connected to the JFET gate.

16. The JFET switching circuit of claim 14, said control section further applying equal negative voltage signals to the gate and source of said current supply enhancement-mode FET to prevent it from supplying current to the JFET when the JFET has turned OFF.

17. The JFET switching circuit of claim 16, said control section including a pair of depletion-mode control FETS cascoded with respective enhancement-mode control FETs, said depletion-mode and enhancement mode control FETs having respective gates, sources and drains, the enhancement-mode control FETs receiving the control signal at their gates, and connecting the sources of their respective depletion-mode control FETs to the negative voltage line in response to an OFF input signal, said depletion-mode control FETs having their gates connected to the negative voltage line, and their drains connected respectively to the gates of the JFET and of said current supply FET.

18. A switching circuit for a junction field effect transistor, comprising:
an input voltage line,
a current supply means connected with said input voltage line to supply current to the JFET gate, and
a circuit means enabling said current supply means to supply current to the JFET gate only in response to an actuating input signal and only for a transient period for switching the JFET On,
said current supply means comprising an enhancement-mode FET having a drain, source and gate, with its drain connected to said input voltage line, its source connected to the JFET gate and said circuit means, and its gate connected to said circuit means.

19. The JFET switching circuit of claim 18, said enhancement-mode FET having a smaller area gate than said JFET and thereby switching faster than said JFET during said transient period to provide gate current to said JFET.

20. The JFET switching circuit of claim 18, said circuit means including a pair of voltage setting means connected with the gate and source of said enhancement-mode FET to bias said enhancement-mode FET when the JFET is ON so that said enhancement-mode FET is held OFF.

21. The JFET switching circuit of claim 20, said voltage setting means comprising respective depletion-mode FETs having respective drains, sources and gates, with their drains connected to said input voltage line, their gates connected respectively to the gate and source of said enhancement-mode FET, and their sources connected with their respective gates.

22. The JFET switching circuit of claim 21, the sources of said depletion-mode FETs being connected to their respective gates through respective resistors which limit current variations resulting from variations in circuit processing.

23. The JFET switching circuit of claim 20, said circuit means further comprising a negative voltage line and a control section connected therewith for applying, in response to a control signal, a negative voltage signal to the JFET gate to hold the JFET OFF only in response to a control signal corresponding to an OFF state for the JFET.

24. The JFET switching circuit of claim 23, said control section including a depletion-mode control FET cascoded with an enhancement-mode control FET, said depletion-mode and enhancement-mode control FETs having respective gates, sources and drains, the enhancement-mode control FET receiving the control signal at its gate and connecting the source of the depletion-mode control FET to the negative voltage line in response to an OFF input signal, and the depletion-mode control FET having its gate connected to the negative voltage line and its drain connected to the JFET gate.

25. The JFET switching circuit of claim 23, said control section further applying equal negative voltage signals to the gate and source of said current supply enhancement-mode FET to prevent it from supplying current to the JFET when the JFET has turned OFF.

26. The JFET switching circuit of claim 25, said control section including a pair of depletion-mode control FETs cascoded with respective enhancement-mode control FETs, said depletion-mode and enhancement-mode control FETs having respective gates, sources and drains, the enhancement-mode control FETs receiving the control signal at their gates, and connecting the sources of their respective depletion-mode control FETs to the negative voltage line in response to an OFF control signal, said depletion-mode control FETs having their gates connected to the negative voltage line, and their drains connected respectively to the gates of the JFET and of said current supply FET.

27. A switching circuit for a junction field effect transistor (JFET) having a gate, source and drain, comprising:
an input voltage line,
a current supply means connected with said input voltage line to supply current to the JFET gate,
a circuit means enabling said current supply means to supply current to the JFET gate only in response to a control signal and only for a transient period for switching the JFET ON, and
a negative voltage line and a control section connected together for applying a negative voltage signal to the JFET gate to hold the JFET OFF only in response to an input signal corresponding to an OFF state for the JFET,
said control section including a depletion-mode control FET cascoded with an enhancement-mode control FET, said depletion-mode and enhancement-mode FETs having respective gates, sources and drains, the enhancement-mode control FET receiving the control signal at its gate and connecting the source of the depletion-mode control FET to the negative voltage line in response to an OFF control signal, and the depletion-mode control FET having its gate connected to the negative voltage line and its drain connected to the JFET gate.

* * * * *

Disclaimer 5,055,723—*Derek F. Bowers; Douglas S. Smith*, both of Sunnyvale, Calif., JFET ANALOG SWITCH WITH GATE CURRENT CONTROL. Patent dated Oct. 8, 1991. Disclaimer filed Nov. 12, 1991, by the assignee, Analog Devices, Inc.

The term of this patent subsequent to Oct. 1, 2008, has been disclaimed.

[*Official Gazette February 18, 1992*]